Dec. 23, 1969 D. A. BOELTER 3,486,125

HIGH GAIN AMPLIFIER

Filed Jan. 5, 1968 2 Sheets-Sheet 1

INVENTOR.
DONALD A. BOELTER

BY
Woodard, Weikart, Emhardt & Naughton
Attorneys

INVENTOR
DONALD A. BOELTER
BY
Woodard, Weikart, Emhardt & Naughton
Attorneys

United States Patent Office 3,486,125
Patented Dec. 23, 1969

3,486,125

HIGH GAIN AMPLIFIER

Donald A. Boelter, Indianapolis, Ind., assignor to General Aviation Electronics, Inc., Indianapolis, Ind., a corporation of Indiana Filed Jan. 5, 1968, Ser. No. 696,034
Int. Cl. H03f 3/18, 3/68
U.S. Cl. 330—17 2 Claims

ABSTRACT OF THE DISCLOSURE

A high gain amplifier having PNP transistor connected in cascade with an NPN transistor, circuitry to provide bias, input signals and output signals for the amplifier and two impedance networks for controlling the feedback of the amplifier.

BACKGROUND OF THE INVENTION

Field of the invention

The field of the invention is generally electronic amplifiers, and more particularly, high gain transistor amplifiers.

Description of the prior art

Since the advent of the transistor, many amplifier circuits have been developed to take advantage of its unique electrical characteristics. These may be found in any standard reference work on the subject, and in many handbooks published by transistor manufacturers. Still, there is need for improvement in transistor amplifier design. For example, a given gain and band width may be realizable with an existing amplifier having four transistors. Yet, it is desirable to provide the same gain and band width with three or even two transistors. Likewise, there is a need for reducing the number of other circuit components used in the amplifiers, such as capacitors and resistors. Such reductions result not only in a saving on the cost of components, but also in the cost of labor to assemble the amplifier.

SUMMARY OF THE INVENTION

The present invention is an improved high gain transistor amplifier having two transistors connected in cascade. The first stage may have an NPN transistor connected as a common emitter stage and its collector directly coupled to the base of a PNP transistor that is connected as a common collector stage. By connecting a first bias resistor between a source of positive voltage and the emitter of the PNP transistor, and a second bias resistor between the emitter of the PNP transistor and the collector of the NPN transistor, an amplifier is provided that requires one resistor and one capacitor fewer than a prior art amplifier using two NPN stages.

It is therefore an object of the present invention to provide an improved high gain transistor amplifier.

It is another object of the present invention to provide a transistor amplifier requiring fewer circuit components than similar prior art transistor amplifiers.

It is yet another object of the present invention to provide a transistor amplifier having high gain while at the same time requiring fewer circuit components than similar prior art amplifiers.

These and other objects and advantages of the preesnt invention will become apparent as the description proceeds, reference being had to the following detailed description, the attached drawings and the appended claims.

DESCRIPTION OF THE PREFERRED EMBODIMENT

Figure 1:
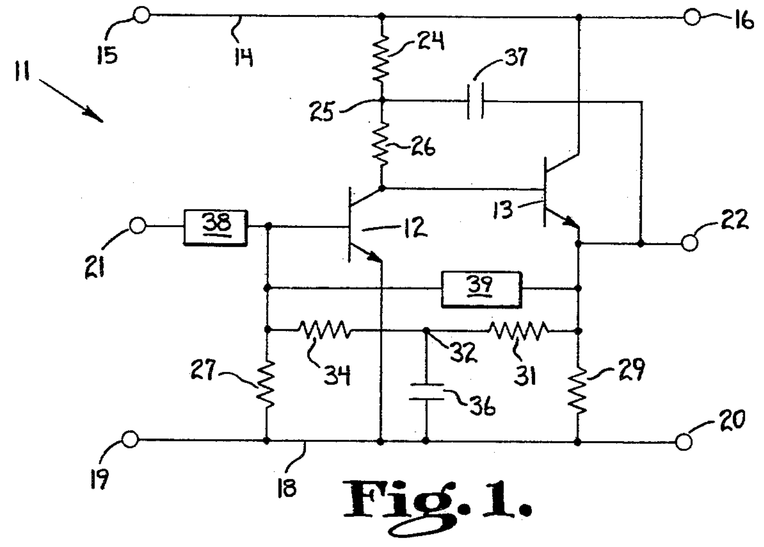
FIG. 1 is a schematic diagram of a prior art two transistor amplifier.

To foster a better understanding of the amplifier of the present invention reference is first made to FIG. 1 which shows a schematic diagram of a prior art amplifier. In the prior art amplifier, indicated generally at 11, there is a first transistor 12 and a second transistor 13. Transistors 12 and 13 are both NPN type transistors as indicated by conventional symbols. A conductor 14 having terminals 15 and 16 is connected to the positive terminal of a DC voltage source (not shown). A conductor 18 having terminals 19 and 20 is connected to the negative terminal of said DC voltage source which may be called a reference voltage. The amplifier 11 is provided with a signal input terminal 21 and a signal output terminal 22.

A resistor 24 is connected between conductor 14 and a junction 25 and a resistor 26 is connected between junction 25 and the collector of transistor 12. The emitter of transistor 12 is connected to conductor 18. A resistor 27 is connected between the base of transistor 12 and conductor 18. It will be recognized by those skilled in the art that transistor 12 is connected as a common emitter amplifier stage.

The collector of transistor 13 is connected to conductor 14 while its emitter is connected through a resistor 29 to the conductor 18. A resistor 31 is connected between the emitter of transistor 13 and a junction 32. A resistor 34 is connected between the junction 32 and the base of transistor 12. A capacitor 36 is connected between the junction 32 and conductor 18. A capacitor 37 is connected between the emitter of transistor 13 and junction 25. A person skilled in the art will recognize that transistor 13 is connected as a comon collector amplifier stage.

Amplifier 11 may be provided with networks, such as input network 38 connected between the signal input terminal 21 and the base of transistor 12 and feedback network 39 connected between the emitter of transistor 13 and the base of transistor 12. Because such networks are well known in the art, they are not described in detail herein, but are merely shown diagrammatically.

The capacitor 37 acts to increase the voltage gain of the amplifier 11. Its effect is to reduce the loading of resistors 24 and 26 on transistor 12 to a very small value at signal frequencies. Resistors 27, 34 and 31 and capacitor 36 provide proper bias for the transistors 12 and 13 and do not materially effect the dynamic performance of the amplifier as long as capacitor 36 effectively bypasses all signal frequencies.

Figure 2:
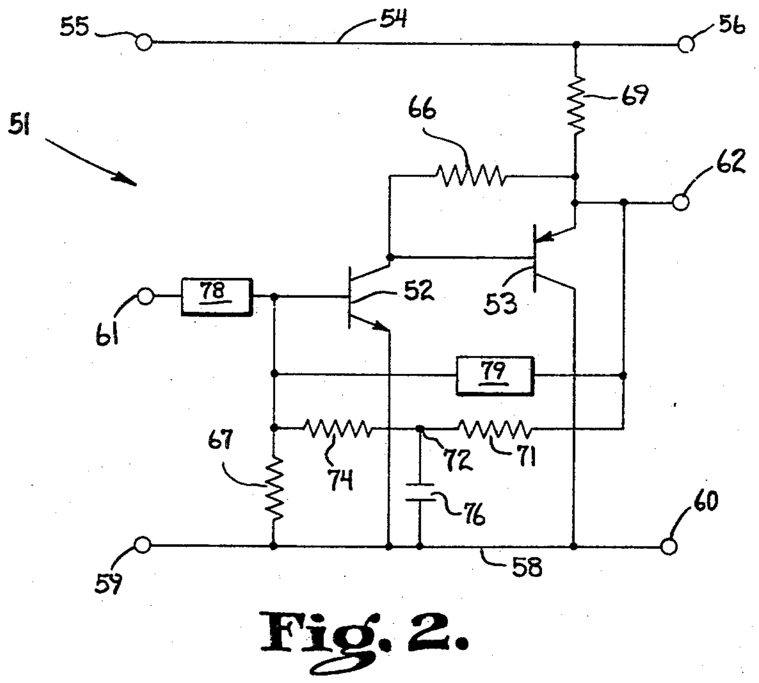
FIG. 2 is a schematic diagram of the transistor amplifier of the present invention.

Turning now to FIG. 2, there is shown a schematic diagram of the transistor amplifier of the present invention indicated generally at 51. Amplifier 51 has a first transistor 52 and a second transistor 53. Transistor 52 is an NPN type transistor and transistor 53 is a PNP type transistor, as indicated by conventional symbols. A conductor 54 having terminals 55 and 56 is connected to the positive terminal of a DC voltage source (not shown). A conductor 58 having terminals 59 and 60 is connected to the negative terminal of said DC voltage source. The amplifier 51 is provided with a signal input terminal 61 and a signal output terminal 62.

A resistor 66 is connected between the collector of transistor 52 and the emitter of transistor 53. The emitter of transistor 52 is connected to conductor 58. A resistor 67 is connected between the base of transistor 52 and conductor 58. It will be recognized that transistor 52 is connected as a common emitter amplifier stage in substantially the same manner as is transistor 12 of amplifier 11.

The collector of transistor 53 is connected to conductor 58 while its emitter is connected through a resistor 69 to conductor 54. A resistor 71 is connected between the emitter of transistor 53 and a junction 72. A resistor 74 is connected between the junction 72 and the base of transistor 52. A capacitor 76 is connected between the junction 72 and the conductor 58. It will be recognized that transistor 53 is connected as a common collector amplifier stage in substantially the same manner as transistor 13 of amplifier 11, the biasing polarities being reversed, however, because transistor 53 is a PNP transistor whereas transistor 13 is an NPN transistor.

Just like amplifier 11, amplifier 51 may be provided with networks, such as input network 78 connected between the signal input terminal 61 and the base of transistor 52 and feedback network 79 connected between the emitter of transistor 53 and the base of transistor 52. Because these networks are well known in the art, they are merely shown diagrammatically.

It will be noted that the resistor 69 of amplifier 51 serves not only as a load resistor for the second stage, but also as a bias resistor for the first stage. This eliminates the need for a second bias resistor in the collector circuit of the first stage, such as the resistor 24 of amplifier 11. Similarly, there is no need in amplifier 51 for a capacitor such as the capacitor 37.

In fact, amplifier 51 has substantially the same voltage gain as amplifier 11, and over a much wider frequency range. This is due mainly to the elimination of capacitor 37 which limits the low frequency response of amplifier 11. Amplifier 51 operates down to zero frequency (DC signal) without degradation or phase shift problems that are caused by capacitor 37 in amplifier 11. This eases the design of low frequency amplifiers.

It should be noted that the transistor types may be interchanged with proper biasing changes. That is, the first stage may be PNP and the second stage NPN.

The values of resistance and capacitance used in the amplifier of the present invention will, of course, vary considerably with the particular transistors used. However, one embodiment of the amplifier might use a 2N5139 transistor for transistor 53. For this circuit, typical parameter values may be: resistor 66—15K; resistor 69—1K; resistor 71—100K; resistor 74—100K; resistor 67—39K; capacitor 76—100/mfd.; feedback network 78 a 100 mfd. capacitor in series with a 47K resistor; feedback network 79 a 470K resistor; and a voltage source of 8.5 v. DC. The circuit so constructed will have an essentially flat response from 1 Hz. to 20 kHz. and a closed loop voltage gain of 10.

Thus, it will be seen that the amplifier of the present invention is an improved transistor amplifier. Not only does it eliminate two components, one resistor and one capacitor, thereby increasing statistical reliability, it also provides improved low frequency response.

It will further be recognized that the amplifier of the present invention, much as the prior art amplifier shown in FIG. 1, are basic, or rudimentary amplifiers that lend themselves to many different applications. For example, by using the proper feedback networks, the amplifier of the present invention may be used as an audio amplifier, or for special applications such as bandpass shaping or computer devices.

Figure 3:
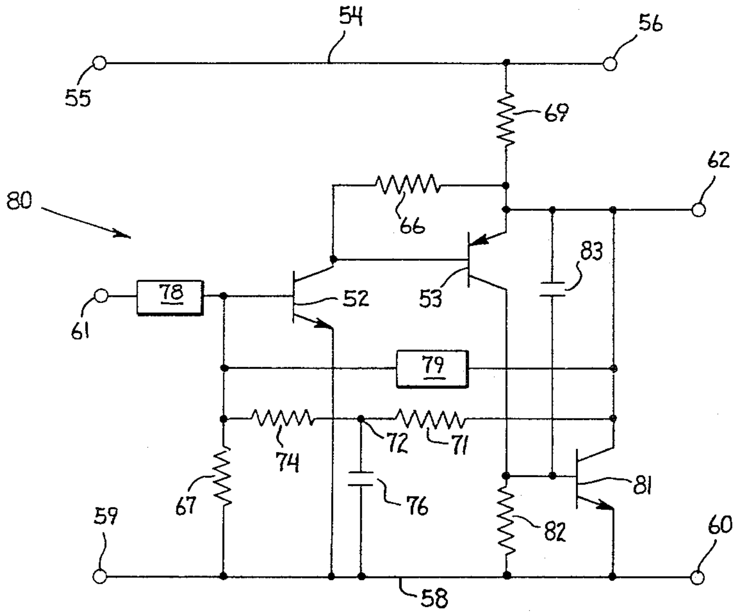
FIG. 3 is a schematic diagram of another embodiment of a transistor amplifier of the present invention.

Referring now to FIG. 3, there is shown another embodiment of the amplifier of the present invention, indicated generally at 80, wherein a third transistor 81, an NPN transistor, is employed to greatly increase the open loop gain of the amplifier. Open loop gains in the neighborhood of 500 are possible with the circuit of FIG. 2. However, open loop gains in the neighborhood of 2000 are achievable with the use of the additional transistor 81 as shown in FIG. 3. In order to provide proper biasing and signal input to transistor 81, a resistor 82 and capacitor 83 are used. The resistor 82 is connected between the collector of transistor 53 and the conductor 58, and the base of transistor 81 is connected to the collector of transistor 53. The capacitor 83 is connected between the emitter and collector of transistor 53. The collector of transistor 81 is connected to the emitter of transistor 53 and the emitter of transistor 81 is connected to conductor 58.

To those skilled in the art, the combination of transistors 53 and 81, connected as shown in FIG. 3, will be recognized as a "compound transistor" arrangement. In combination with transistor 52, this expands the basic usefulness of the circuit of FIG. 2 to include applications where very high gain is required. Typical values for resistor 82 and capacitor 83 are 15K ohms and .001 mfd. respectively. Transistor 81 may be a type 2N5135.

While the invention has been illustrated and described in detail in the drawings and foregoing description, the same is to be considered as illustrative and not restrictive in character, it being understood that only the preferred embodiment has been shown and described and all changes and modifications that come within the spirit of the invention are also desired to be protected.

The invention claimed is:

1. A transistor amplifier comprising:

a first transistor having a base, an emitter and a collector;

a second transistor having a base, an emitter and a collector and being of the complementary type to the first transistor;

a first resistor connected between the collector of said first transistor and the emitter of said second transistor;

said first resistor being the only impedance element between the collector of said first transistor and the emitter of said second transistor;

a second resistor connected between the emitter of said second transistor and a source of DC voltage;

a resistance connected between the emitter of said second transistor and the base of said first transistor;

a third resistor connected between the base of said first transistor and a reference voltage, the emitter of said first transistor and the collector of said second transistor being connected to said reference voltage; and the collector of said first transistor being connected to the base of said second transistor.

2. The invention according to claim 1 wherein said resistance connected between the emitter of said second transistor and the base of said first transistor includes a fourth resistor and a fifth resistor connected in a series and forming a junction therebetween, a capacitor connected between said junction and said reference voltage, a third transistor, a second capacitor and a sixth resistor, the collector of said second transistor being connected to the reference voltage through said sixth resistor, said second capacitor being connected between the emitter and the collector of said second transistor, said third transistor having a base, an emitter and a collector and being of the complementary type to the second transistor, the base of said third transistor being connected to the collector of said second transistor, the collector of said third transistor being connected to the emitter of said second transistor and the emitter of said third transistor being connected to the reference voltage.

References Cited

UNITED STATES PATENTS

| | | | |
|---|---|---|---|
| 2,188,574 | 6/1965 | Parmer | 330—17 X |
| 3,239,770 | 3/1966 | Taber | 330—28 X |
| 3,260,946 | 7/1966 | Beres et al. | 330—17 |
| 3,262,061 | 7/1966 | Kahn | 330—17 |

ROY LAKE, Primary Examiner

JAMES B. MULLINS, Assistant Examiner

U.S. Cl. X.R.

330—20, 25, 26, 28